US006795467B2

(12) United States Patent
Capasso et al.

(10) Patent No.: US 6,795,467 B2
(45) Date of Patent: Sep. 21, 2004

(54) TECHNIQUE FOR MEASURING INTERSUBBAND ELECTROLUMINESCENCE IN A QUANTUM CASCADE LASER

(75) Inventors: Federico Capasso, Westfield, NJ (US); Alfred Yi Cho, Summit, NJ (US); Raffaele Colombelli, Hoboken, NJ (US); Claire F. Gmachl, New Providence, NJ (US); Albert Lee Hutchinson, Columbus, GA (US); Arthur Mike Sergent, New Providence, NJ (US); Deborah Lee Sivco, Warren, NJ (US); Alessandro Tredicucci, Chiavari (IT)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/826,237

(22) Filed: Apr. 4, 2001

(65) Prior Publication Data

US 2002/0146049 A1 Oct. 10, 2002

(51) Int. Cl.[7] .................................................. H01S 3/19
(52) U.S. Cl. .............................. 372/44; 372/45; 372/43
(58) Field of Search ............................................ 372/44

(56) References Cited

U.S. PATENT DOCUMENTS 5,780,867 A * 7/1998 Fritz et al. ..................... 257/13
5,936,989 A   8/1999 Capasso et al.
5,953,356 A   9/1999 Botez et al.
6,055,257 A   4/2000 Baillargeon et al.
6,137,817 A  10/2000 Baillargeon et al.
6,144,681 A  11/2000 Capasso et al.
6,148,012 A  11/2000 Capasso et al.
6,326,646 B1 * 12/2001 Baillargeon et al. .......... 257/94
6,500,688 B2 * 12/2002 Bruno et al. .................. 438/39
2002/0131463 A1 * 9/2002 Bruno et al. .................. 372/45

\* cited by examiner

*Primary Examiner*—Hoanganh Le
*Assistant Examiner*—Dung Michael T Nguyen

(57) ABSTRACT

The measurement of intersubband electroluminescence (ISB-EL) in unipolar quantum cascade lasers is achieved by forming a longitudinal cleave through the active region and waveguide of the QC laser device, exposing a complete side face of the device, including the active region. The conventional laser facets at the entrance and exit of the active region are coated with a highly reflective material and the emission from the exposed side face is measured. In theory, the sideface emission would comprise only the ISB-EL spontaneous emission, but some additional laser emission (due to scattering in the imperfect waveguide structure) also exits along this sideface. Spatial filtering and/or polarization monitoring can be used to differentiate the laser emission from the ISB-EL spontaneous emission.

4 Claims, 5 Drawing Sheets

TECHNIQUE FOR MEASURING INTERSUBBAND ELECTROLUMINESCENCE IN A QUANTUM CASCADE LASER

GOVERNMENT CONTRACTS

This invention was made with Government support under contract No. DAAD19-00-C-0096 awarded by the DARPAfUS Army Research Office. The Government has certain rights in this invention.

TECHNICAL FIELD

The present invention relates to the field of quantum cascade lasers and, more particularly, to the measurement and characterization of their intersubband electroluminescence.

BACKGROUND OF THE INVENTION

As has been described extensively in the prior art (see, for example, F. Capasso et al., IEEE J. Select. *Topics in Quantum Electr.*, Vol.6 (6), p. 931–947 (2000)), a quantum cascade (QC) laser is based on intersubband transitions between excited states of coupled quantum wells, utilizing resonant tunneling as the pumping mechanism. Unlike all other semiconductor lasers (e.g., diode lasers), the wavelength of the laser emission of a QC laser is essentially determined by quantum confinement; i.e., by the thickness of the layers of the active region material. As such, it can be tailored over a very wide range without modifying the semiconductor material itself. For example, QC lasers with AlInAs/GaInAs active regions have operated at mid-infrared wavelengths in the 3 to 24 $\mu$m range. In diode lasers, in contrast, the bandgap of the active region is the main factor in determining the lasing wavelength.

More specifically, diode lasers, including quantum well lasers, rely on transitions between energy bands in which conduction band electrons and valence band holes, injected into the active region through a forward-biased p-n junction, radiatively recombine across the bandgap. Thus, as noted above, the bandgap essentially determines the lasing wavelength. In contrast, the QC laser relies on only one type of carrier; i.e., it is a unipolar semiconductor laser in which electronic transitions between conduction band states arise from size quantization in the active region heterostructure.

Even though QC lasers have been the subject of much research and study since their initial development in 1994, the nature of their electron distribution function is still not well understood. An article by M. Troccoli et al., *Applied Physics Letters*, 77,1088-1090 (2000), discusses the possibility of extracting the excited state electronic population from the intersubband (ISB) emission of QC electroluminescence structures. Unfortunately, ISB electroluminescence (EL), the best experimental probe for this type of analysis, in practice cannot be measured above laser threshold, due to the large intensity difference between laser emission and electroluminescence emission, as well as the lack of detectors with a large enough dynamic range.

SUMMARY OF THE INVENTION

The present invention relates to a technique for measuring intersubband electroluminescence (ISB-EL) above laser threshold which is accomplished by cleaving the laser stripe along its length and detecting the ISB spontaneous emission from the direction orthogonal to the axis of the optical cavity.

In particular, a QC laser is cleaved longitudinally (along the active region) and the laser facets are subsequently coated with a highly reflective material. A detector is disposed to capture the spontaneous emission which will exit from the active region along the cleaved face. The detector will also measure the scattered laser emission, resulting from defects in the laser material or waveguide, thereby allowing for the determination of the threshold current density ($J_{th}$) of the device.

In one embodiment of the present invention, the laser stripe is cleaved along the direction orthogonal to the laser facets and approximately in the middle of the waveguide, using a diamond tip device. The scattered nature of the light can be analyzed by its polarization; the ISB-EL emission is fully TM polarized, and laser light is unpolarized due to the scattering process.

BRIEF DESCRIPTION OF THE DRAWINGS

Referring now to the drawings.

DETAILED DESCRIPTION

As described above, intersubband electroluminescence (ISB-EL) is considered to be one of the best probe for extracting excited state electronic population information from a QC laser. However, due to the large intensity difference between laser emission and luminescence emission (and the lack of detectors with a sufficiently large dynamic range), it has heretofore been extremely difficult to collect information regarding the electroluminescence in particular during laser operation. In accordance with the present invention, it has been found that by cleaving a QC laser in the longitudinal direction along its active stripe and subsequently coating the laser facets with a highly reflective (HR) material, it is possible to detect the ISB spontaneous emission from a QC laser in a direction orthogonal to its laser axis.

Figure 1:
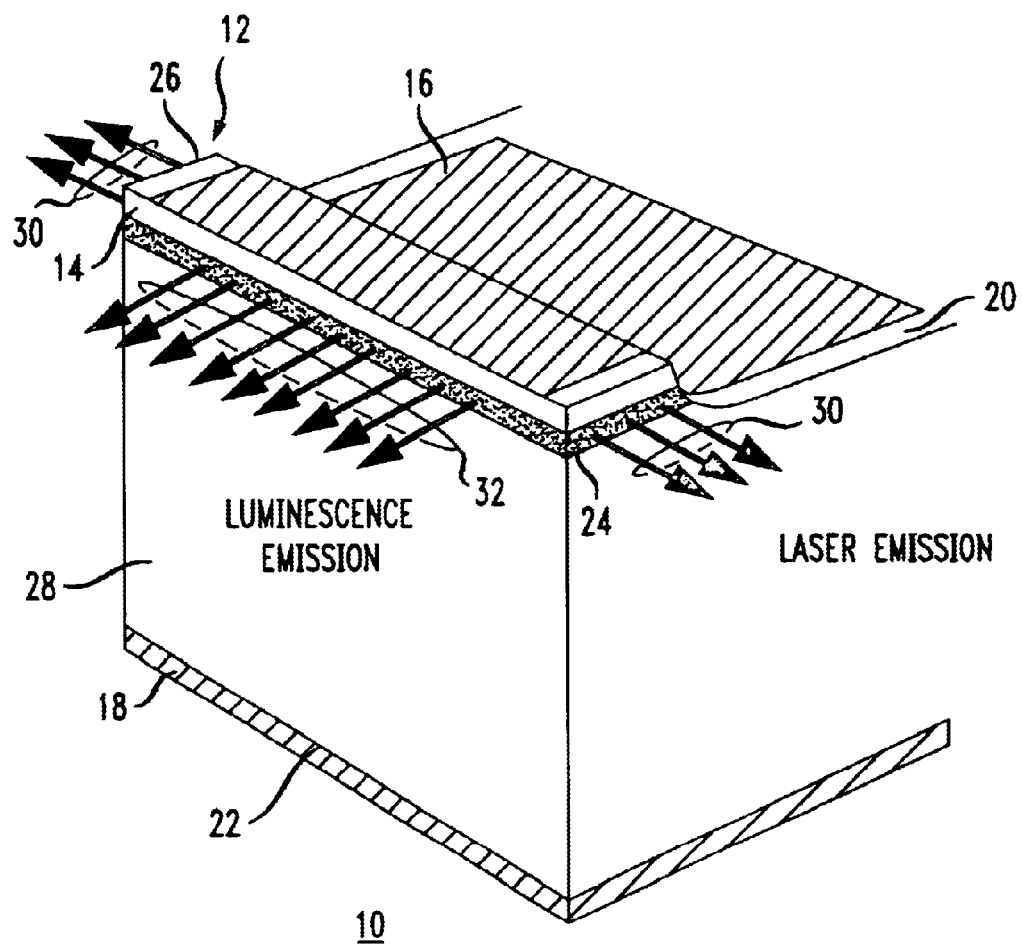
FIG. 1 contains a diagram of a longitudinally cleaved QC laser useful to perform the ISB-EL measurement in accordance with the present invention.
Figure 2:
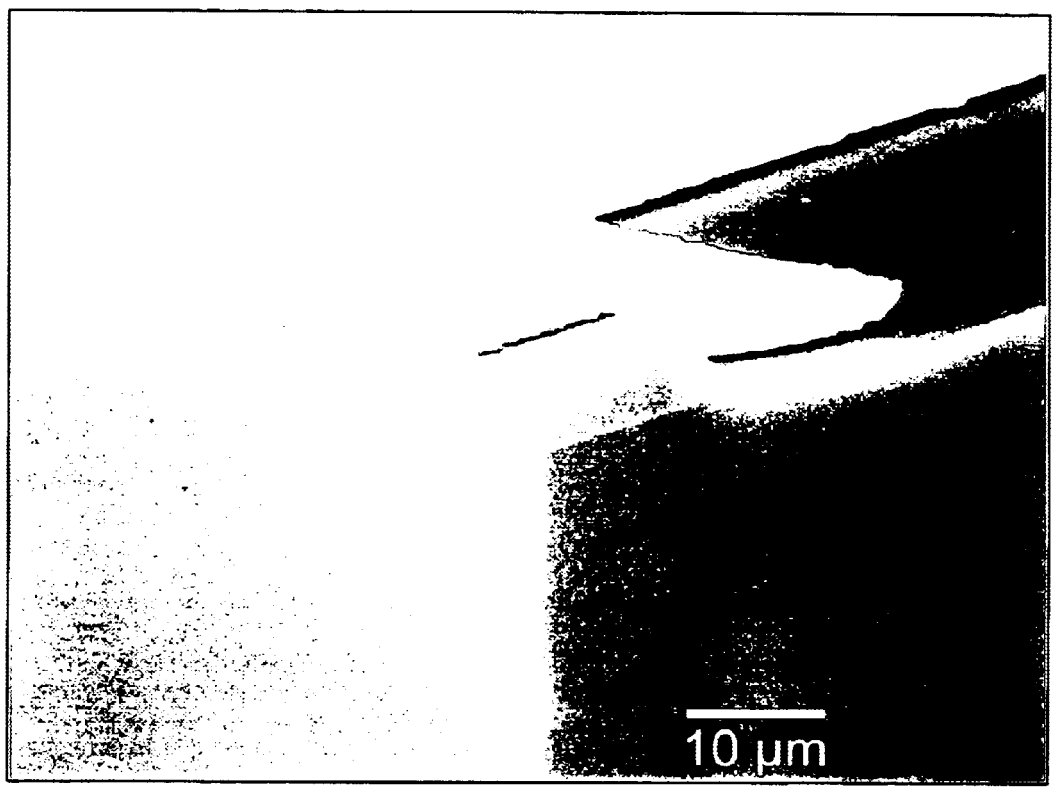
FIG. 2 is a scanning electron micrograph of an actual QC laser cleaved in accordance with the present invention to perform the ISB-EL measurement.

FIG. 1 illustrates, in diagram form, an exemplary QC laser 10 that has been cleaved so as to be useful for ISB-EL measurement in accordance with the present invention. FIG. 2 is a scanning electron micrograph of an actual QC laser that has been subjected to this cleaving process. In one method of forming such a cleaved laser structure, the semiconductor wafer is first processed into 50 $\mu$m wide deep-etched stripes by optical contact lithography and wet chemical etching—both processes being well-known in the prior art. An exemplary waveguide stripe 12 is illustrated in device 10 of FIG. 1. A layer 14 of insulation, such as silicon nitride, is then deposited on waveguide stripe 12 and metallic contacts 16 and 18 are evaporated on top surface 20 and bottom surface 22, respectively, of device 10.

After the formation of contacts 16 and 18, device 10 is cleaved along the direction orthogonal to laser facets 24 and 26, illustrated as cleaved face 28 in FIG. 1 and defined along the y-z plane of device 10. In a preferred embodiment, device 10 is cleaved in approximately the middle of waveguide stripe 12, where a diamond tip cleaving tool may be used. Subsequently, laser facets 24 and 26 are cleaved and coated with a highly reflective material (for example, a layer of Ti/Au, with an underlayer of $SiO_2$ to prevent shorting).

In order to perform the ISB-EL measurement, the device 10 as shown in FIGS. 1 and 2 is then mounted on a supporting substrate (such as a copper block), wire bonded, and placed in a cold-finger helium-flow cryostat for measurement purposes. When QC device 10 is biased, laser emission 30 will exit both facets 24 and 26 along active region 30 of device 10 in case no HR coating was applied; or will be largely blocked by the coating. In accordance with the present invention, the intersubband electroluminescence 32 will exit active region 30 along cleaved plane 28, as shown in FIG. 1.

Since spontaneous emission is isotropic and laser light is stimulated solely along the laser cavity, photons detected from cleaved plane 28 should ideally originate only from spontaneous emission and provide an accurate measurement of the ISB-EL activity in a QC laser. However, any imperfection in the structure will result in scattering laser photons such that a fraction of the laser light will also exit along cleaved plane 28. Accordingly, a spatial filter exhibiting a low numerical aperture (of a few millimeters, for example), can be located in front of the device and aids in lowering the intensity ratio of the detected laser light with respect to the electroluminescence. Additionally, the two emissions can be distinguished in terms of their polarization. More particularly, the laser light will be unpolarized, due to being scattered, while the electroluminescence will be fully TM polarized. An added benefit of the laterally cleaved structure of the present invention is that the scattered laser light can be separately analyzed and measured to determine the laser threshold current density $J_{th}$ for the device. In fact, the capability to perform such a measurement has resulted in the finding that the process of laterally cleaving the QC laser structure does not increase the threshold current density for the device and, in fact, a slight improvement in threshold current is observed, likely due to the reduced mirror losses attributed to the HR coatings on the laser facets.

Figure 3:
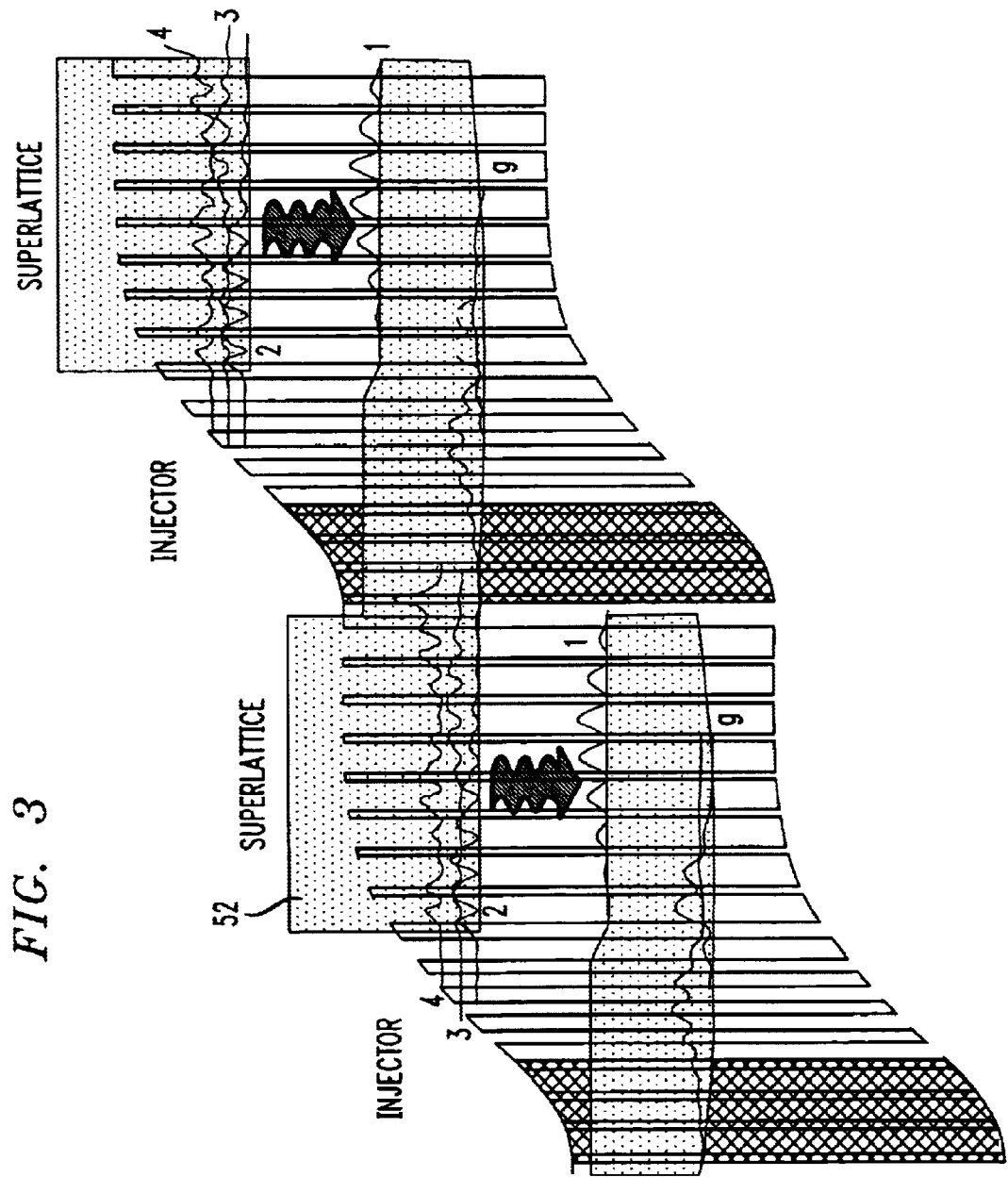
FIG. 3 contains an energy level band diagram of an exemplary QC laser, with the electron minibands being slightly shaded and the square moduli of the relevant wave functions illustrated.

FIG. 3 illustrates a schematic energy band diagram for an exemplary QC laser structure, where in this case the energy level separation between states 2 and 3 of upper miniband 50 (referring to FIG. 3, state 1 is defined as the top-most energy state of lower miniband 52) is 19 meV, well below the LO-phonon energy ($E_{lo}$), implying an increased intersubband relaxation time $\tau_{3 \to 2}$ (i.e., "bottleneck" effect), due to suppression of electron-phonon scattering. In this region, $\tau_{3 \to 2}$ is determined by electron—electron scattering and by electrons with a large in-plane wavevector that possesses enough energy for the emission of LO phonons. The intersubband relaxation time $\tau_{3 \to 2}$ can become as large as several picoseconds, depending on carrier density and temperature. Increased $\tau_{3 \to 2}$ (and almost equal values of the optical dipoles matrix elements for the energy state transitions 2→1 ($Z_{21}$=2.04 nm) and 3→1 ($Z_{31}$=2.34 nm) can be used to explain the multi peaked subthreshold spectrum typically observed with this structure and, in particular, the above-gap laser action at the 3→1 transition.

Figure 4:
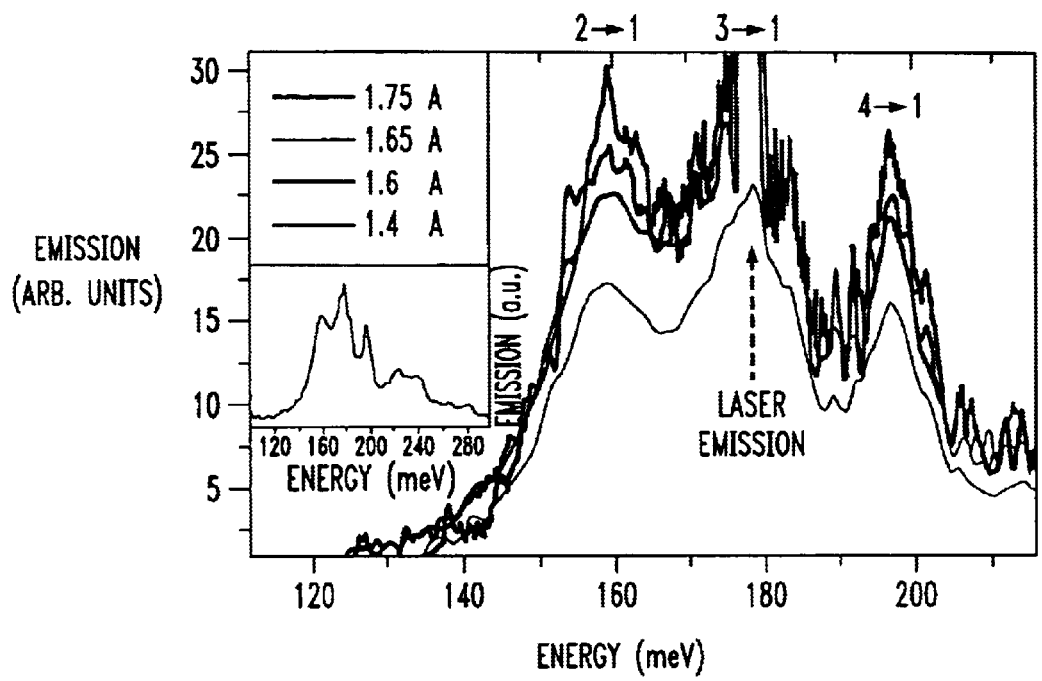
FIG. 4 illustrates the sub-threshold and above-threshold spectra for an exemplary QC laser, measured at 10° K, in pulsed mode, with a threshold current of approximately 1.6A.

FIG. 4 illustrates the results of the ISB-EL measurement, performed in accordance with the present invention, on a laterally cleaved QC laser having the energy band structure shown in FIG. 3. The spectra were obtained at various current levels, as shown, in pulsed condition (70 ns pulse width, 80 kHz repetition rate), and at a sample temperature of 10° K. This particular device was found to have a threshold current ($I_{th}$) of approximately 1.6A, and the broad, multi-peaked spontaneous emission is visible both below and above threshold, as shown. The above threshold measurements have been heretofore virtually impossible to record from laser facet measurements. Thus, by virtue of using the laterally cleaved structure formed in accordance with the present invention, the spectra can be measured at a bias current as high as 1.75A, as shown.

Figure 5:
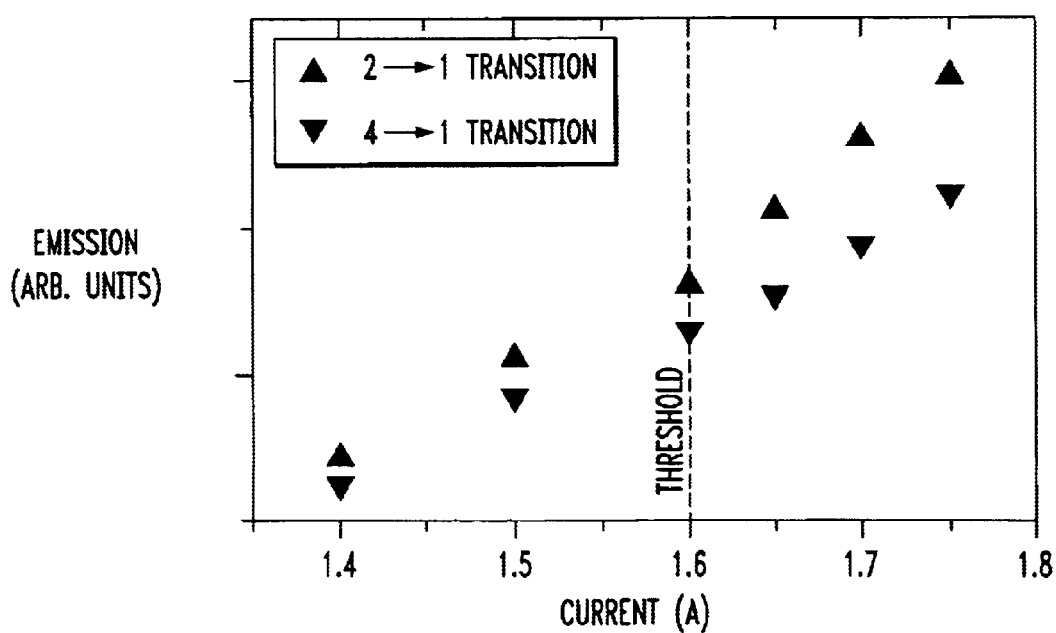
FIG. 5 is a graph of the peak emission intensities of the 2→1 and 4→1 transitions as a function of the injected current.

FIG. 5 illustrates the peak emission intensities of the 2→1 and 4→1 transitions as a function of bias current. As shown, the emission intensities exhibit a constant increase of spontaneous emission both above and below threshold—contrary to the expectation for spontaneous emission in a lasing system. In principle, the onset of lasing action should lock the population difference between the inverted states (in this case, $n_3$–$n_1$). Under the assumption that state 1 is empty (which is frequently assumed for QC lasers), $n_3$ is therefore locked and any increase in current should cause an increase of the laser light, not the spontaneous emission. However, the observed increase in spontaneous emission from the structure of the present invention can be used to prove that the relaxation times are so slow that states 2 and 4 are almost decoupled from the lasing system (i.e., the 3→1 transition). In fact, the relation $n_2=\tau_2=\alpha J/e+(\tau_2/\tau_{32})n_3$ (which results from a simple rate equation argument, $\alpha$ being defined as the injection efficiency into level 2) implies that $n_2$ would also exhibit a partial "locking" behavior, unless $\tau_{2 \ll \tau_{32}}$. Therefore, the only channel effective for laser action (in particular, from the injection region into the upper miniband of the active region) is the one through state 3, while all the carriers injected in levels 4 and 2 must contribute to spontaneous emission proportional to the injected carrier densities. Therefore, these electrons are lost to the laser process, a result heretofore not directly experimentally confirmed, without the inventive capability of directly measuring the ISB-EL emission from the laterally cleaved QC laser structure.

Figure 6:
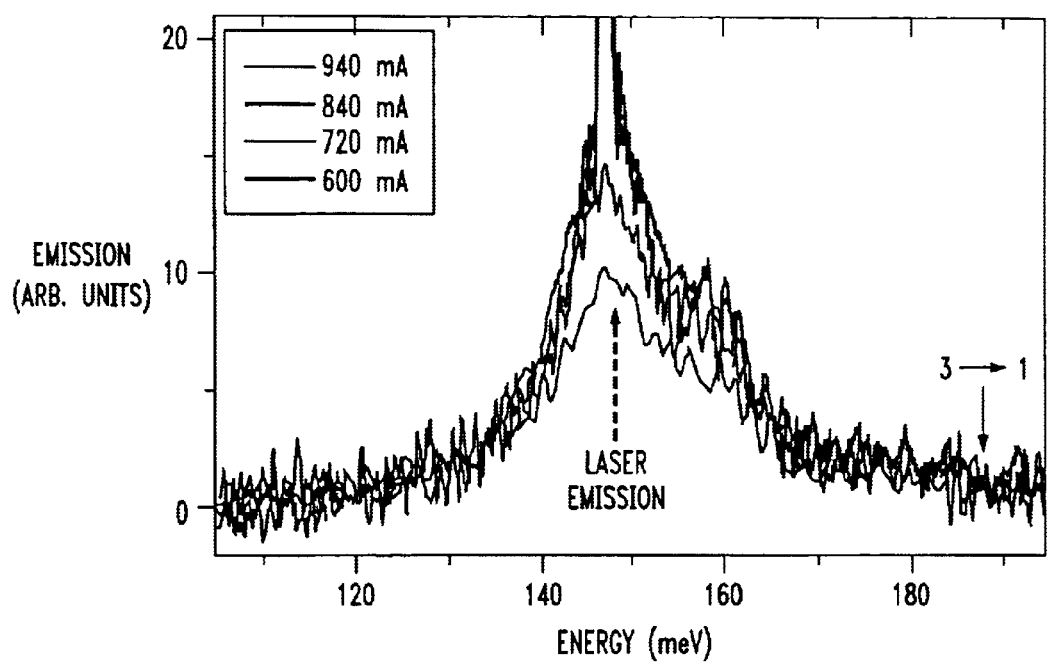
FIG. 6 illustrates the sub-threshold and above-threshold spectra for a different QC laser, with a threshold current of approximately 740mA.

This bottleneck effect between states 3 and 2 can be mitigated by modifying the QC laser design to exhibit an energy separation $E_{32}$ at the design field equal to the LO-phonon energy, and with an optimized dipole for the 2→1 transition. FIG. 6 illustrates the measured ISB-EL spectra for such a device, under both sub-threshold and abovethreshold conditions. The 3→1 emission, as shown, is virtually non-existent for this device, demonstrating the improved efficiency in the relaxation rate between states 3 and 2 (as a result of coupling with the phonon field). This effect can also be partially attributed to the optical dipoles matrix elements now being more concentrated in the 2→1 transition ($Z_{21}$=3.1 nm) than in the 3→1 transition ($Z_{31}$=0.6 nm).

Figure 7:
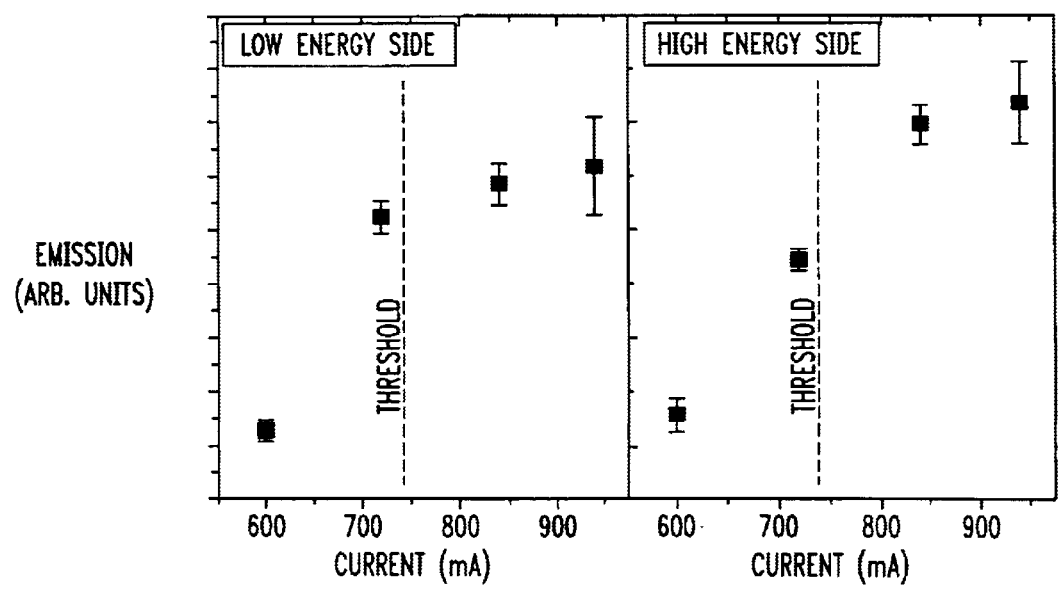
FIG. 7 illustrate the emission intensities below and above laser emission for the laser of FIG. 6, as a function of the injected current.

FIG. 7 illustrates the spontaneous emission intensities at an energy immediately below (left panel) and above (right panel) the laser frequency as a function of injected current. Unlike the graph of FIG. 5, where the spontaneous emission continued to increase for increasing current values, the spontaneous emission for this particular QC laser structure moves closer to saturation as the current rises above the threshold value ($I_{th} \approx 740$ mA). The exhibition of the spontaneous emission approaching saturation is thus indicative of the fact that the majority of the additionally injected carriers are converted into laser light.

What is claimed is:

1. A unipolar quantum cascade (QC) laser device particularly configured to provide a measurement of intersubband electroluminescence (ISB-EL) said QC laser device comprising the following layers and regions formed on a semiconductor substrate:

a core region including a QC active region which comprises a multiplicity of unipolar radiative transition regions interleaved with a multiplicity of unipolar injection/relaxation regions, upper and lower cladding regions bounding said core region, at least said cladding region and said core region having the shape of a longitudinal stripe having sidewalls and a top surface, said lower cladding region disposed to cover a top major surface of said semiconductor substrate, a top metal contact layer disposed over the stripe-shaped upper cladding region a bottom metal contact layer disposed to overlay a bottom major surface of said semiconductor substrate; and a pair of laser facets formed as the terminations of said swipe-shaped core region, said facets formed to be orthogonal to said longitudinal strive-shaped core region such that upon the application of a bias current between said top and bottom metal contact layers, laser emission will be created in a longitudinal direction along said QC active region and exit at said pair of laser facets characterized in that the unipolar quantum cascade laser structure is formed to include a longitudinal cleave through the stripe-shaped upper cladding and core regions so as to expose the QC active region, and the laser facets are formed to include a highly reflective surface coating, such that intersubband electroluminescence (ISB-EL) will exit from the exposed QC active region.

2. The device of claim 1 wherein the upper and lower cladding regions each comprises a layer of SiN.

3. The device of claim 1 wherein the top and bottom metal contaCt layers comprise Ti/Pt/Au.

4. The device of claim 1 wherein the pair of laser facets comprise coatings include including an inner layer of SiO$_2$ and an outer layer of Ti/Au and Ge/Au/Ag/Au, respectively.

* * * * *